United States Patent
Watanabe

[11] Patent Number: 5,827,366
[45] Date of Patent: Oct. 27, 1998

[54] CZOCHRALSKI GROWING APPARATUS SUPPRESSING GROWTH STRIATION OF LONG LARGE-DIAMETER MONOCRYSTALLINE SILICON

[75] Inventor: Masahito Watanabe, Tokyo, Japan

[73] Assignee: NEC Corporation, Tokyo, Japan

[21] Appl. No.: 754,158

[22] Filed: Nov. 22, 1996

[30] Foreign Application Priority Data

Nov. 22, 1995 [JP] Japan ................................... 7-304791

[51] Int. Cl.⁶ ................................................ C30B 35/00
[52] U.S. Cl. .............................. 117/202; 117/30; 117/32; 117/917
[58] Field of Search ............................... 117/30, 32, 200, 117/202, 217, 222, 900, 917

[56] References Cited

U.S. PATENT DOCUMENTS 5,009,865  4/1991  Boden et al. ............................. 117/15
5,258,092  11/1993 Yamagishi et al. ..................... 117/917

FOREIGN PATENT DOCUMENTS 63-252991  10/1988  Japan .
401100100 A  4/1989  Japan ..................................... 117/919
08231294 A   9/1996  Japan .

OTHER PUBLICATIONS

K.M. Kim et al., "Maximum Length of Large Diameter Czochralski Silicon Single Crystals at Fracture Stress Limit of Seed", *Journal of Crystal Growth,* vol. 100, 1990, pp. 527–528.

*Primary Examiner*—Felisa Garrett
*Attorney, Agent, or Firm*—Sughrue, Mion, Zinn, Macpeak & Seas, PLLC

[57] ABSTRACT

In a Czochralski monocrystalline silicon growing apparatus for growing a silicon monocrystalline by pulling up a crystal seed by a wire in a growing furnace, a magnetic ring is mounted on the silicon monocrystal, and an electromagnet is fixed to the growing furnace for pulling up the magnetic ring.

6 Claims, 4 Drawing Sheets

CZOCHRALSKI GROWING APPARATUS SUPPRESSING GROWTH STRIATION OF LONG LARGE-DIAMETER MONOCRYSTALLINE SILICON

BACKGROUND OF THE INVENTION

1. Field of the Invention

The present invention relates to a Czochralski (CZ) monocrystalline silicon growing apparatus, and more particularly, to a CZ monocrystalline silicon growing apparatus suppressing growth striation of a long large-diameter crystal.

2. Description of the Related Art

In a CZ monocrystalline silicon growing apparatus, a seed crystal is dipped in molten silicon in a quartz crucible to grow a "seed neck". The seed neck is gradually pulled up by a wire having a chuck for fixing the seed neck at a constant pull rate, thus obtaining a monocrystalline silicon rod. The seed neck is the mechanically weakest point to support the weight of the monocrystalline silicon rod. Thus, the maximum weight of the monocrystalline silicon rod is limited by the mechanical strength of the seed neck (see K. M. Kim et al., "Maximum Length of Large Diameter Czochralski Silicon Single Crystals at Fracture Stress Limit of Speed", Journal of Crystal Growth 100, pp. 527–528, 1990).

If the monocrystalline silicon rod exceeds the maximum weight, the monocrystalline silicon rod may fall down into the molten silicon. In a prior art CZ monocrystalline silicon growing apparatus, in order to prevent the monocrystalline silicon rod from falling into the molten silicon, a shoulder part, i.e., a wider part is formed on the monocrystalline silicon rod, and when the monocrystalline silicon rod is pulled up, a safety ring is moved up to locate at a position immediately beneath the shoulder part (see JP-A-63-252991). Therefore, should the seed neck break, the monocrystalline silicon rod never falls into the molten silicon due to hanging of the shoulder in the safety ring.

In the above-mentioned prior art CZ monocrystalline silicon growing apparatus, note that the safety ring does not serve as means for pulling up the monocrystalline silicon rod.

Even in the above-mentioned prior art CZ monocrystalline silicon growing apparatus, however, when the monocrystalline silicon rod is relatively heavy even if the monocrystalline silicon rod does not break, the tension of the wire is large so that the wire may stretch, and in addition, the stretching of the wire may fluctuate. Further, the wire is also stretched by the temperature within the growing apparatus. Therefore, the pull rate of the monocrystalline silicon rod cannot be constant. In other words, the pull rate of the monocrystalline silicon rod is fluctuated. Particularly, when the monocrystalline silicon rod has a diameter larger than 31.72 cm (12 inches) and a length greater than 1 m, the pull rate of the monocrystalline silicon rod is fluctuated. Further, the pull rate of the monocrystalline silicon rod is fluctuated by the vibration of a pulling mechanism of the wire.

The fluctuation of the pull rate of the monocrystalline silicon causes a nonhomogeneous distribution of impurities therein. The nonhomogenous distribution of impurities creates growth striation, which may cause crystal defects in silicon wafers formed from the monocrystalline silicon rod.

SUMMARY OF THE INVENTION

It is an object of the present invention to provide a CZ growing apparatus for growing a long large-diameter monocrystalline silicon capable of suppressing growth striation.

According to the present invention, in a CZ monocrystalline silicon growing apparatus for growing a silicon monocrystal by pulling up a crystal seed by a wire in a growing furnace, a magnetic ring is mounted on the silicon monocrystal, and an electromagnet is fixed to the growing furnace for pulling up the magnetic ring. The electromagnet includes a plurality of electromagnet elements arranged in a perpendicular direction. Therefore, when the electromagnet elements are energized sequentially from a lower side to an upper side, the magnetic ring can be gradually pulled up at a constant pull rate by the electromagnet.

BRIEF DESCRIPTION OF THE DRAWINGS

The present invention will be more clearly understood from the description as set forth below, with reference to the accompanying drawings, wherein.

DESCRIPTION OF THE PREFERRED EMBODIMENTS

Figure 1:
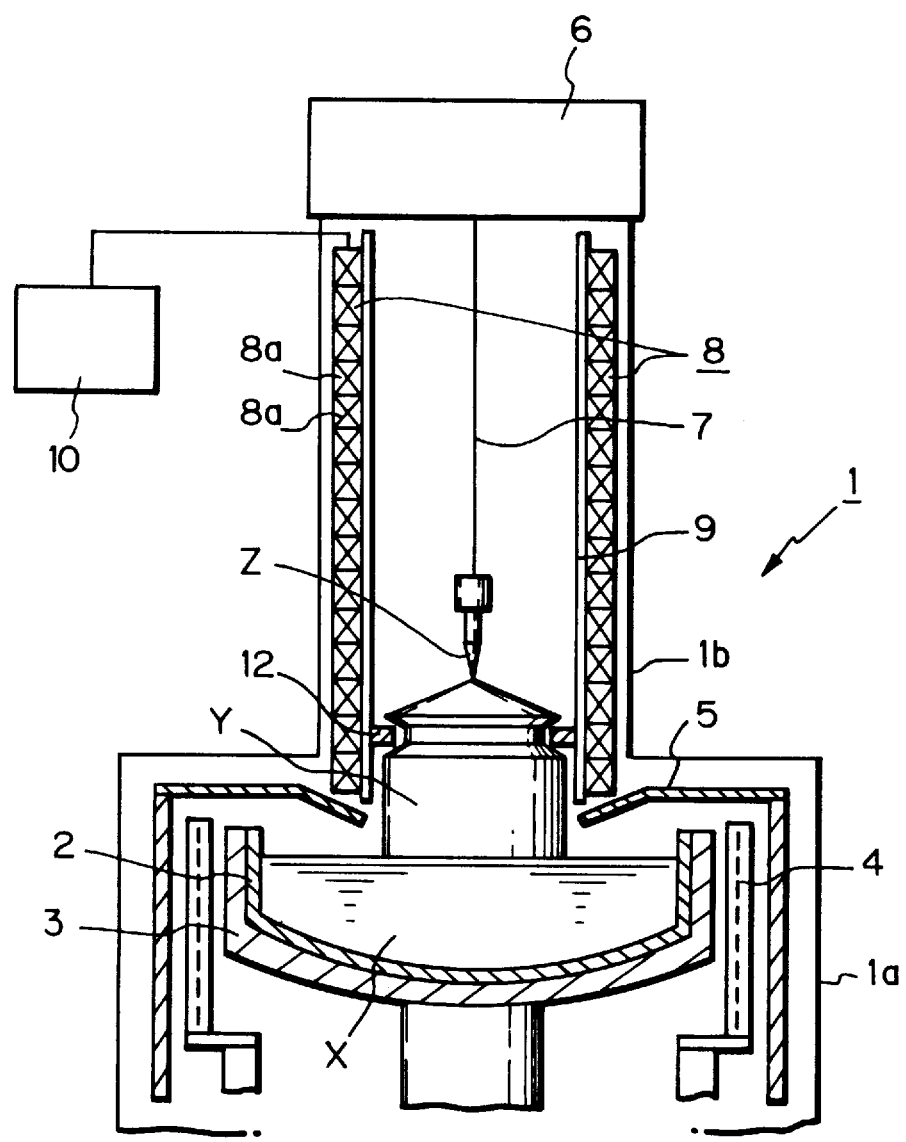
FIG. 1 is a cross-sectional view illustrating an embodiment of the CZ monocrystalline silicon growing apparatus according to the present invention.

In FIG. 1, which illustrates an embodiment of the present invention, reference numeral 1 designates a growing furnace. Provided in a lower part 1a of the growing furnace 1 are a quartz crucible 2 and a carbon crucible 3 combined with the quartz crucible 2. The quartz crucible 2 and the carbon crucible 3 are heated by a heater 4 surrounding them. As indicated by X, silicon is put into the quartz crucible 2 and is heated by the heater 4 into molten liquid.

Also, a heat shielding plate 4 covers the quartz crucible 2, the carbon crucible 3 and the heater 4 to prevent heat from affecting an upper part 1b of the growing furnace 1. In this case, the heat shielding plate 4 has an opening for pulling up a monocrystalline silicon rod Y.

The upper part 1b of the growing furnace 1 is cylindrical, and provided on the top of the upper part 1b is a pulling mechanism 6 for pulling up a wire 7 made of metal. Also, provided at inner circumferential surface of the upper part 1b is a electromagnet 8 formed by a plurality of cylindrical electromagnet elements 8a arranged in a perpendicular direction with respect to the furnace 1. The electromagnet 8 is covered by a quartz tube 9 to prevent the interior of the furnace 1 from being contaminated by the electromagnet 8. The electromagnet elements 8a are individually controlled by a controller 10.

A crystal seed Z is coupled to the wire 7. Therefore, when the wire 7 is pulled up by the pulling mechanism 6, the monocrystalline silicon rod Y starts to grow from the molten silicon X.

Figure 2A:
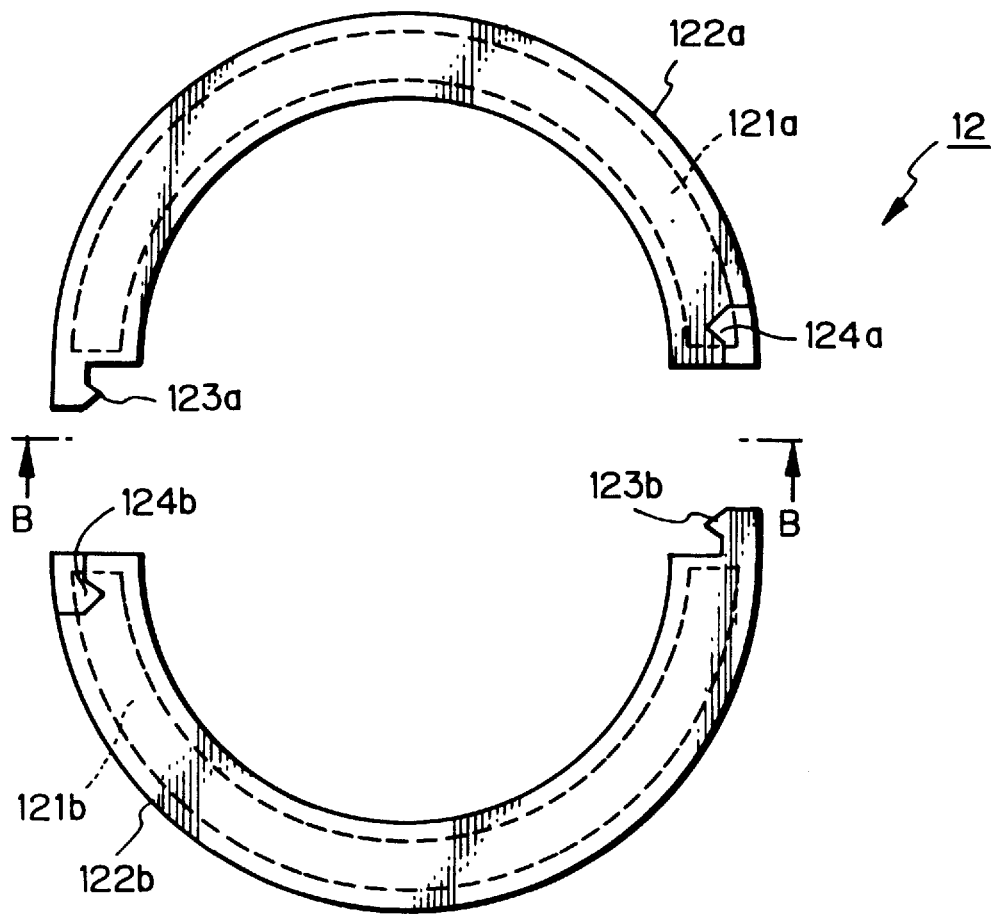
FIG. 2A is a plan view of the magnetic ring of FIG. 1.
Figure 2B:
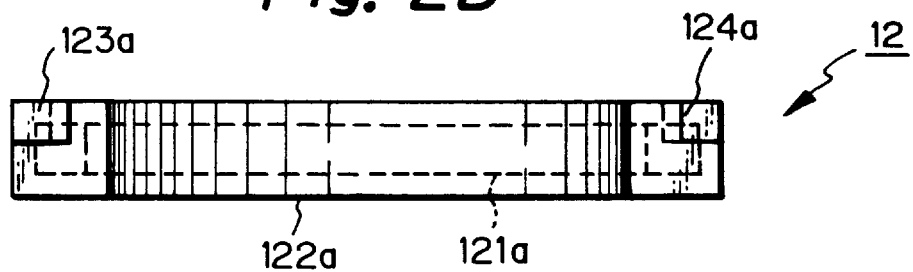
FIG. 2B is a side view of the magnetic ring of FIG. 1.

Also, a magnetic ring 12 is mounted on a circumferential recess portion of the monocrystalline silicon rod Y. The magnetic ring 12 is illustrated in FIGS. 2A and 2B. That is, the magnetic ring 12 is formed by two semicircular ferromagnetic elements 121a and 121b made of iron or nickel. Each of the ferromagnetic elements 121a and 121b are covered by quartz glass elements 122a and 122b, respectively. The quartz glass element 122a has a hook 123a at one end and a hook recess portion 124a at the other end, and the quartz glass element 122b has a hook 123b at one end and a hook recess portion 124b at the other end. Therefore, the magnetic ring 12 is obtained by fitting the hooks 123a and 123b into the hook recess portions 124b and 124a, respectively. For example, if the diameter of the monocrystalline silicon rod Y is 31.72 cm (12 inches), the diameter of the magnetic ring 12 is about 25.6 cm (10 inches).

The method for manufacturing a silicon monocrystal by using the growing apparatus of FIG. 1 is explained next with reference to FIGS. 3A, 3B, 3C and 3D.

Figure 3A:
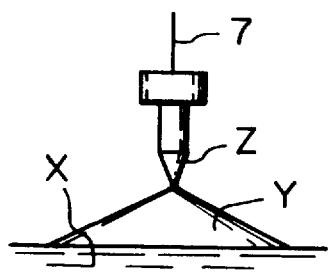
FIGS. 3A, 3B, 3C, 3D and 3E are diagrams showing a method for growing a monocrystalline silicon rod using the apparatus of FIG. 1.
Figure 3B:
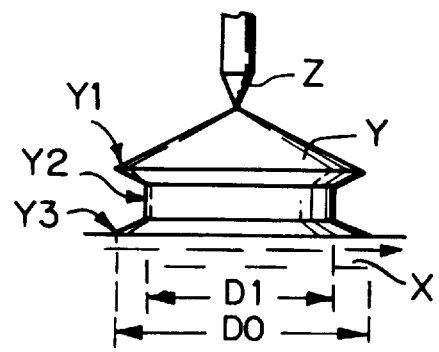

First, referring to FIG. 3A, a crystal seed Z is dipped by the wire 7 into the molten silicon X. Then, the crystal seed Z is gradually pulled up by the wire 7, to grow the monocrystalline silicon rod Y Next, referring to FIG. 3B, when the diameter of the monocrystalline silicon rod Y reaches a predetermined diameter D0 as indicated by Y1, the pull rate of the crystal seed Z by the wire 7 is sufficiently raised and the temperature of the molten silicon X is increased. As a result, the diameter of the monocrystalline silicon rod Y is reduced by about 20 percent as indicated by Y2. That is, the diameter D1 of the monocrystalline silicon rod Y is about 0.8–D0. In this state, the wire 7, i.e., the crystal seed z is pulled up by about 2 cm. Then, the pull rate of the crystal seed Z by the wire 7 is reduced and the temperature of the molten silicon X is decreased. Therefore, the diameter of the monocrystalline silicon rod Y increases back to D0 as indicated by Y3. Thus, a circumferential recess portion is formed in the monocrystalline silicon rod Y.

Figure 3C:
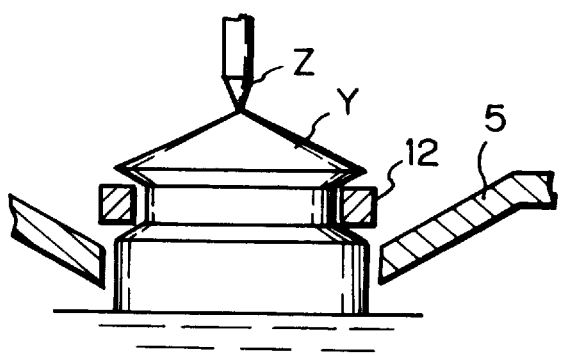
Figure 3D:
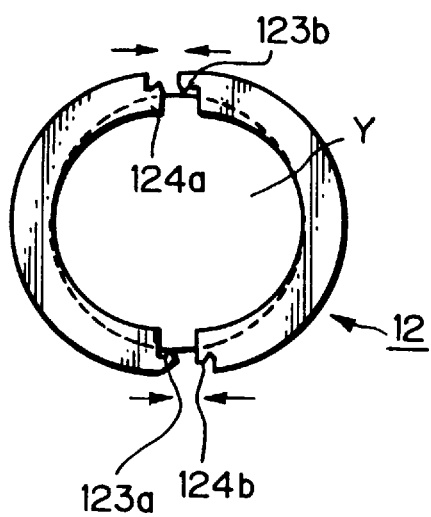

Next, referring to FIG. 3C, when the circumferential recess portion of the monocrystalline silicon rod Y reaches an upper location of the heat shielding plate 5, the magnetic ring 12 is mounted on the circumferential recess portion of the monocrystalline silicon rod Y by fitting the hooks 123a and 123b into the hook recess portions 124b and 124a, respectively, as illustrated in FIG. 3D.

Figure 3E:
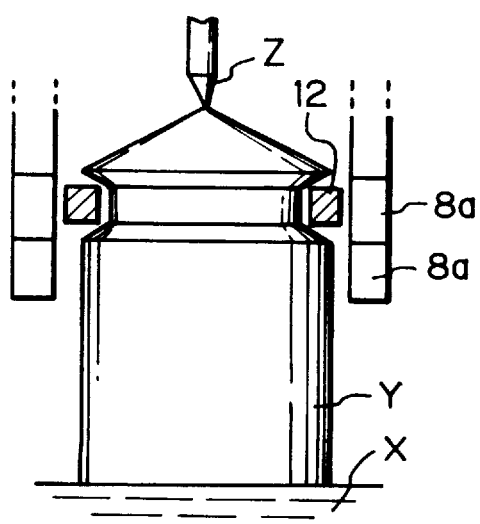

Finally, referring to FIG. 3E, when the magnetic ring 12 reaches each of the electromagnet elements 8a, the electromagnet elements 8a are sequentially energized by the controller 10. As a result, an induced magnetic force is applied to the magnetic ring 12 so that the magnetic ring 12 is pulled up by the magnetic force, which pulls up the monocrystalline silicon rod Y. Therefore, the tension of the wire 7 is relaxed. In this case, the energization of the electromagnet elements 8a by the controller 10 is carried out in synchronization with the motion of the magnetic ring 12, i.e., the motion of the monocrystalline silicon rod Y.

Thus, even when the weight of the monocrystalline silicon rod Y is increased, the tension of the wire 7 is relaxed by the pull-up motion of the magnetic ring 12 and the electromagnet 8. As a result, the stretching of the wire 7 is suppressed. In addition, since the pull rate of the monocrystalline silicon rod Y is regulated by the motion of the electromagnet 12, the pull rate of the monocrystalline silicon rod Y can be constant even if the stretching of the wire 7 is fluctuated by the temperature within the furnace 1 or by the vibration of the mechanism 6. Thus, growth striation can be suppressed in the monocrystalline silicon rod Y.

Figure 4:
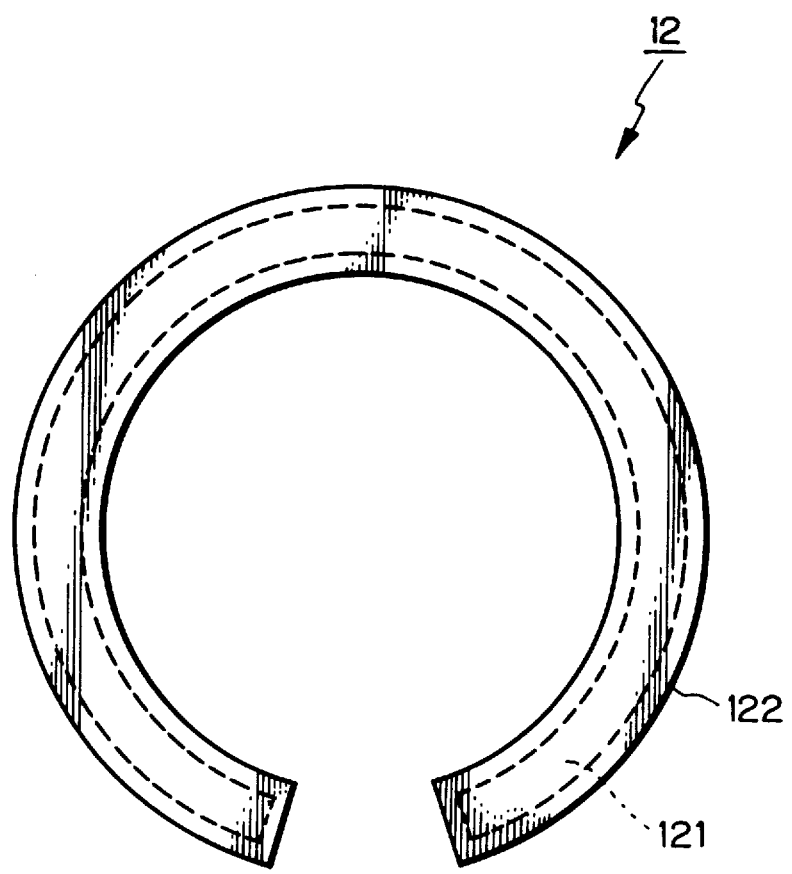
FIG. 4 is a plan view illustrating a modification of the magnetic ring of FIGS. 2A and 2B.

In FIG. 4, which illustrates a modification of the magnetic ring 12 of FIGS. 2A and 2B, the magnetic ring 12 is a C-type ring formed by a ferromagnetic element 121 and a quartz glass element 122. In this case, the magnetic ring 12 of FIG. 4 is mounted on the monocrystalline silicon rod Y by using an elastic force of the C-type ring 12.

According to the inventor's experiments, no growth striation have been found in a 1.5 m long, 30.48 cm (12 inches) diameter monocrystalline silicon rod, 1.5 m long, 35.56 cm (14 inches) diameter monocrystalline silicon rod, a 1.2 m long, 40.64 cm (16 inches) diameter monocrystalline silicon rod, and 1.0 m long, 45.72 cm (18 inches) diameter monocrystalline silicon rod, manufactured by using the growing apparatus of FIG. 1. On the other hand, growth striation have been found in a 1.0 m long, 30.48 cm (12 inches) diameter monocrystalline silicon rod, 0.7 m long, 35.56 cm (14 inches) diameter monocrystalline silicon rod, a 0.5 m long, 40.64 cm (16 inches) diameter monocrystalline silicon rod, and 0.4 m long, 45.72 cm (18 inches) diameter monocrystalline silicon rod, manufactured by using a prior art growing apparatus.

As explained hereinabove, according to the present invention, since growth striation are not generated in monocrystalline silicon rods, crystal defects can be suppressed in silicon wafers obtained from the monocrystalline silicon rods.

I claim:

1. A Czochralski monocrystalline silicon growing apparatus comprising:

a crucible for putting molten silicon thereinto;

a mechanism for pulling up a crystal seed by a wire to grow a monocrystalline silicon rod from said molten silicon;

a magnetic ring for being mounted on said monocrystalline silicon rod; and a fixed electromagnet for pulling up said magnetic ring.

2. The apparatus as set forth in claim 1, wherein said electromagnet comprises:

a plurality of electromagnet elements arranged in a direction perpendicular to said apparatus; and a quartz glass tube for covering said electromagnet elements.

3. The apparatus as set forth in claim 2, further comprising a controller for sequentially controlling said electromagnet elements from a lower side to an upper side.

4. The apparatus as set forth in claim 1, wherein said magnetic ring comprises:

two semicircular ferromagnetic elements; and two quartz glass elements for covering said semicircular ferromagnetic elements.

5. The apparatus as set forth in claim 1, wherein said magnetic ring comprises:

a C-type ferromagnetic element; and a quartz glass element for covering said C-type ferromagnetic element.

6. A Czochralski monocrystalline silicon growing apparatus comprising:

a crucible for putting molten silicon thereinto;

a mechanism for pulling up a crystal seed to grow a monocrystalline silicon rod from said molten silicon;

a magnetic ring for being mounted on said monocrystalline silicon rod; and an electromagnet for moving said magnetic ring with respect to said electromagnet.

* * * * *